United States Patent [19]

Fukuzo

[11] Patent Number: 5,495,454
[45] Date of Patent: Feb. 27, 1996

[54] SEMICONDUCTOR MEMORY DEVICE

[75] Inventor: Yukio Fukuzo, Tokyo, Japan

[73] Assignee: NEC Corporation, Tokyo, Japan

[21] Appl. No.: 159,233

[22] Filed: Nov. 30, 1993

[30] Foreign Application Priority Data

Dec. 1, 1992 [JP] Japan ................. 4-321730

[51] Int. Cl.⁶ ................. G11C 8/00; G11C 7/00
[52] U.S. Cl. ................. 365/230.080; 365/230.03;
365/230.06; 365/203; 365/222
[58] Field of Search ................. 365/230.08, 230.03,
365/230.05, 233.5, 189.01, 203, 222

[56] References Cited

U.S. PATENT DOCUMENTS

| | | | |
|---|---|---|---|
| 3,691,538 | 9/1972 | Haney et al. | 365/63 |
| 4,773,048 | 9/1988 | Kai | 365/230.03 |
| 4,905,201 | 2/1990 | Ohira et al. | 365/230.03 |
| 4,972,373 | 11/1990 | Kim et al. | 365/230.03 |
| 4,985,868 | 1/1991 | Nakano et al. | 365/230.08 |
| 5,249,160 | 9/1993 | Wu et al. | 365/230.08 |
| 5,287,325 | 2/1994 | Morita | 365/230.03 |
| 5,301,162 | 4/1994 | Shimizu | 365/230.03 |
| 5,349,565 | 9/1994 | Wu et al. | 365/230.08 |

FOREIGN PATENT DOCUMENTS 0128499  12/1984  European Pat. Off. .

OTHER PUBLICATIONS

Hiroaki Nambu, et al., 4-K Bit Bipolar Ram with On-Chip Address Latch Function, Electronics and Communications in Japan, Oct. 1987, vol. 70, No. 10, pp. 45-54.

*Primary Examiner*—Tan T. Nguyen
*Attorney, Agent, or Firm*—Mion, Zinn, Macpeak & Seas Sughrue

[57] ABSTRACT

A memory device comprises a plurality of memory cell array blocks (CAB1) each having at least one word line (WL11) and associated with a word line drive circuit (PD1a, WD1a, RD1), a block select circuit (BSa) for selectively outputting a block select signal (SL1s) corresponding to one of the memory cell array blocks, an address buffer (AB1a) for outputting word address signals (AddR1) to the memory cell array blocks wherein the word line drive circuit is associated with an address latch circuit (AL1a) which latches and continuously outputs one of the word address signals thereto, the block select signal activates the address latch circuit for latching one of the word address signals, the word line drive circuit continuously activates the word line according to an output signal (AL1aout) of the address latch circuit and deactivates the word line only when the block select signal (SL1s) corresponding to the memory cell array block is output from the block select circuit.

5 Claims, 12 Drawing Sheets

SEMICONDUCTOR MEMORY DEVICE

BACKGROUND OF THE INVENTION

This invention relates to a semiconductor memory device, more particularly to a dynamic type random access memory device capable of partial activation of a memory cell array that is divided into a plurality of blocks.

Recently the partial activation technique in RAM devices has been developed in which a memory cell array is divided into a plurality of memory cell array blocks and selectively activated to output read data and/or to receive write data. According to this technique, only one or a few memory cell array blocks are activated to connect certain memory cells selected in accordance with address signals to bit lines and other memory cell array blocks are maintained in deactivated states in which the bit lines remain in precharged state. Therefore, in the device performing the partial activation operation, the current consumption owing charging and discharging the bit lines, that is, voltage inversions on the bit lines, which do not correspond to the selected memory cells is decreased. In particular, since the current consumption of the RAM device is mainly caused by the voltage inversion on the bit lines, the total current consumption of the RAM device is effectively decreased.

This type of prior art device is explained with reference to FIG. 11 and 12. As shown in FIG. 11, the RAM device comprises n block areas B1 . . . Bn, a timing controller TC for receiving control signals $\overline{RAS}$, $\overline{CAS}$, an address buffer AB1 for receiving a row address signal AddR and a block address signal AddB which is associated with a refresh counter RC for outputting the row address signal AddR and the block address signal AddB to the address buffer AB1 in order to refresh certain memory cell array blocks CAB1, CABn, an address buff for AB2 for receiving a column address signal AddC, and a block selector for outputting block selection signals SL1 . . . SLn. The block area B1 has a memory cell array block CAB1 including the memory cells MC111 each associated with a word line WL11 and the bit line pair BL111a, BL111b, a sense amplifier circuit SA1 associated with a sense amplifier driver SAD1 which outputs a high level signal to activate the sense amplifier circuit SA1 according to the high level state of the block selection signal SL1, a column selector CS1 associated with a column decoder CD1 which is activated according to the high level state of the signal SL1, a row decoder RD1 associated with a word driver WD1 which outputs a high level signal to activate the row decoder RD1 according to the high level state of the signal SL1, an x-predecoder PD1 which predecodes the row address signal AddR1 according to the high level state of the signal SL1, a bit line balance and precharge circuit BB1 associated with a bit line balance and precharge circuit driver BBD1 which outputs a high level signal to activate the bit line balance and precharge circuit BB1 according to the high level state of the signal SL1. Each of the other block areas Bn has equivalent elements respectively. The sense amplifier circuits SA1 . . . SAn are connected to a common data line DL1a which is connected to a read amplifier RA9 associated with an output buffer OB9, and to a write amplifier WA9 associated with an input buffer IB9.

The operation of this device is as follows. To perform a read operation, according to FIG. 12, the row and block address signals AddR and AddB are preliminary changed and, at time t11, the external input row address strobe signal $\overline{RAS}$ goes to the low level. Then the address latch signal AL11 being output from the timing controller TC to the address buffer AB1 turns to the high level and enables the address buffer AB1 to latch the address signals AddR, AddB. The address enable signal AE11 also turns to the high level subsequently and enables to the address buffer AB1 to output the row address signal AddR1 and the block address signal AddB1. In this state, the block selection signals SL1 . . . SLn are at the low level so that the output signals of the sense amplifier drivers SAD1 . . . SADN, the word drivers WD1 . . . WDn and the bit line balance and precharge circuit drivers BBD1 . . . BBDn are at the low level. Therefore the sense amplifier circuits SA1 . . . SAn and the row decoders RD1 . . . RDn are deactivated and do not amplify voltages of any bit line pairs BL11a, BL11b or select any word lines WL11, respectively, whereas the bit line balance and precharge circuits BB1 . . . BBn are activated to balance and precharge the bit line pairs BL11a, BL11b. Then the block address signal AddB1 is supplied to the block selector BS which decodes the address signal AddB1 and selectively turns one of the block selection signals SL1 . . . SLn to the high level. FIG. 12 shows a case where the block selection signal SL1 turns to the high level, selecting the memory cell array block CAB1. Therefore the x-predecoder PD1 is activated according to the block selection signal SL1 to receive, and predecodes the row address signal AddR1 and outputs the predecoded address signal PD1out to the row decoder RD1. This predecode operation takes the predecode time Tpd shown in FIG. 12. Concurrently the sense amplifier driver SAD1, the word driver WD1 and the bit line balance and precharge circuit driver BBD1 turn their output signals SAD1out, WD1out, BBd1out to the high level according to the signal SL1 as shown in FIG. 12 so that the bit line balance and precharge circuit BB1 is deactivated to stop the balance and precharge operation and the row decoder RD1 is activated and becomes capable to decode the predecoded address signal PD1out and drive the selected word line WL11. The sense amplifier circuit SA1 is also activated and, at the certain timing after the word line WL11 is driven to the high level and the memory cells MC111 are connected to the bit line pairs BL11a, BL11b, starts to amplify the voltages on the bit line pairs BL11a, BL11b. In the nonselected block areas Bn, the memory cell array blocks CABn are maintained in the balanced and precharged state and the x-predecoders PDn are also deactivated. Therefore, the current consumption owing to the charging and discharging operations in the nonselected memory cell array blocks CABn is prevented and the current consumption in the x-predecoder PDn owing to predecode operations thereof is also prevented.

Meanwhile, when the column address strobe signal $\overline{CAS}$ goes to the low level, the timing controller TC outputs the address latch signal AL21 and the address enable signal AE21 the address buffer AB2 which outputs the column address signal AddC1 to the column decoders CD1 . . . CDn. In this case, however, only the column decoder CL1 is activated according to the signal SL1 so that the column decoder CD1 output the column selection signal to the column selector CS1 which selectively connect the bit line pair BL11a, BL11b and the amplifier associated therewith to the data line DL1a. Consequently, the data in the selected memory cell MC111 of the memory cell array block CAB1 is output and transferred to the read amplifier RA9 via the data line Db1a.

According to the transition of the signal $\overline{CAS}$ to the high level, the address buffer AB2 stops outputting the column address signal AddC1 so that the column selector CS1 also stops connecting the bit line pair to the data line DL1a and the data transfer operation on the data line DL1a is completed at the time t21 as shown in FIG. 12. That is, the access operation to the memory cell array block CAB1 is substantially completed at this time t21.

After that the signal $\overline{RAS}$ goes to the high level at the time t31 and the address buffer AB1 stops outputting the address signal AddB1 to the block selector BS which, therefore, turns the block selection signal SL1 to the low level. Therefore, the sense amplifier driver SAD1, the word driver WD1, the x-predecoder PD1 and the bit line balance and precharge circuit driver BBD1 output the low level signals and the voltage of the selected word line WL11 is decreased to the low level at the time t41 as shwon in FIG. 12. Then all of the memory cell array blocks CAB1 . . . CABn enter the balanced and precharged state wherein any word lines WL11 or bit line pairs BL11a, BL11b are not selected. After time t41, the RAM device is in an initial state again and ready to perform the next operations at time t51 shown in FIG. 12.

The write operation is performed in almost the same manner as the read operation. When the input buffer IB9 is activated according to a write enable signal WE, the write data is transferred via the write amplifier WA9 and the data line DL1a to the selected memory cell MC111 according to the address signals AddR, AddB, AddC.

During a refresh mode operation on the memory cell array block CAB1, the address buffer AB1 outputs the address signal AddB1 which indicates the memory cell array block CAB1 according to a control signal from the refresh counter RC. Then the address buffer AB1 continuously outputs the address signals AddR1 indicating the all or particular row addresses of the memory cell array CAB1 which needs refresh operation according to the control signal from the refresh counter RC. Therefore, in the memory cell array block CAB1, the word lines WL11 corresponding to the address signals AddB1 are activated and the memory cells MC111 associated therewith are refreshed by the sense amplifier circuit SA1, that is, the memory cells MC111 are fully charged or discharged according to the stored data thereof. The refresh operations on any other memory cell array blocks CABn are performed in a same manner as above.

The page mode operation, in which a word line is activated and a number of memory cells associated with the word line are accessed to perform read or write operations continuously in order to increase the access speed, is also achieved in almost the same manner as the above mentioned read write operations. In the page mode operation, the signal $\overline{CAS}$ turns to the low level several times so as to input or output the data during an single time period wherein the signal $\overline{RAS}$ continues to be at the low level, that is, between the time t11 to t31 in FIG. 10.

However, as apparent from the above explanation, in this prior art device, since the selected word line WL11 is at high level only during a certain time period corresponding to the signal $\overline{RAS}$, it is neccessary to maintain the signal $\overline{RAS}$ in the low level until the access operation, that is a read or write operation, is substantially completed at the time t21 in order to avoid any operation errors which may occur when the word line voltage is decreased too early. In other words, the operations for activating the selected word line and deactivating it are respectively needed just before and just after the column access operation which is indicated by the signal $\overline{CAS}$. Therefore, in this device, the comparatively long interval, which corresponds to the period between the time t21 and t51, is needed and the total access operation time, which is determined by the time t11 and t61, becomes quite long, even when the different memory cell array blocks are selected sequentially.

Moreover, even when this prior art device performs page mode operations, since the page mode operations to be performed subsequently must have a long interval there between as mentioned above, the total operation speed is not effectively improved. In particular, in the device having a plurality of memory cell array blocks, each word line is formed in short length so as to reduce the current consumption as mentioned above, so that the number of memory cells associated with a common word line is comparatively small, that is, the number of data bits which can be dealt with in a single page mode operation is highly restricted. Therefore, the page mode operations must have many long intervals, making total operation time of the device long.

Furthermore, since it is necessary to maintain the signal $\overline{RAS}$ in the low level all through the access operation, when one memory cell array block CAB1 is activated to perform a page mode operation, which takes a comparatively long time, any other memory cell array blocks CABn cannot be accessed even though the word drivers WDn, the row decoders RDn and the x-predecoders PDn thereof are not used in the operation on the activated memory cell array block CAB1, but are available to perform the next operations. This device is, similarly, not available to perform any read and/or write operations when one memory cell array block is in a self refresh operation mode. Accordingly, the total operation speed of this prior art device is considerably low and, moreover, this prior art device is restricted in its use and cannot be available for flexible uses, such as, the frame buffer application, in which the data of one page or one word line of a memory cell array block are read out and transferred continuously into a certain page of a video RAM device which corresponds to a certain frame of video picture and, at the same time, the data corresponding to the next page (frame) are prepared or generated in any other part of the video system and transported into a certain page of another memory cell array block so as to increase the operation speed of the memory device and the whole of the video system.

SUMMARY OF THE INVENTION

Therefore the object of the invention is to provide a semiconductor memory device having a plurality of cell array blocks capable of high speed read and/or write operations for use in extensive applications. The device of this invention achieves high speed page mode operations which are performed sequentially. The device can perform a page mode operation on one memory cell array block and another page mode operation or random read and/or write operations on any other memory cell array blocks at the same time.

The memory device of this invention comprises a plurality of memory cell array blocks each having at least one word line and associated with a word line drive circuit, a block select circuit for selectively outputting a block select signal corresponding to one of the memory cell array blocks, an address buffer for outputting word address signals to the memory cell array blocks wherein the word line drive circuit is associated with an address latch circuit which latches and continuously outputs one of the word address signals thereto and the block select signal activates the address latch circuit for latching one of the word address signals. The word line drive circuit continuously activates the word line according to an output signal of the address latch circuit and deactivates the word line only when the block select signal corresponding to the memory cell array block is output from the block select circuit.

PREFERRED EMBODIMENTS

Figure 1:
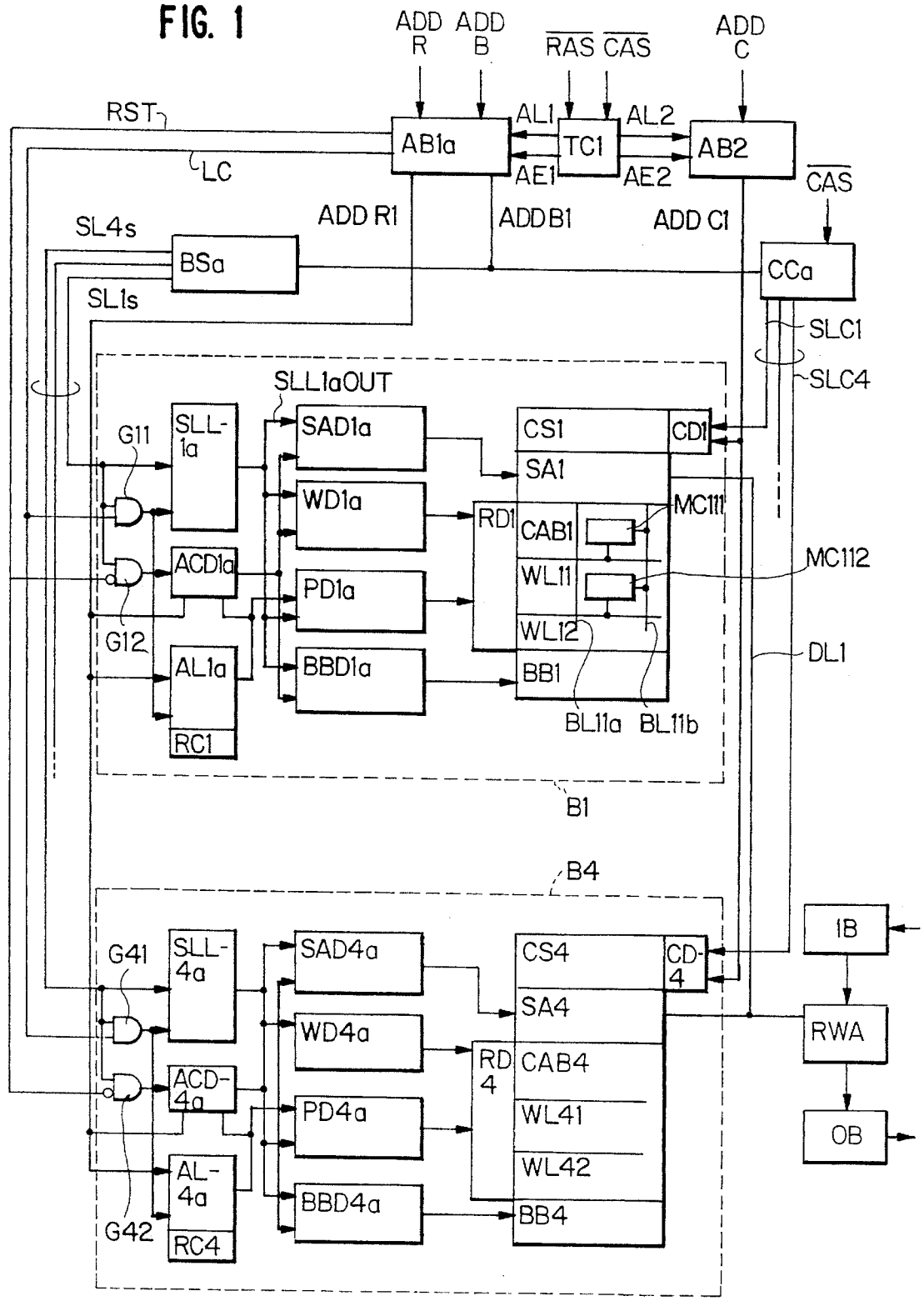
FIG. 1 is a block diagram of a memory device embodying the present invention.
Figure 11:
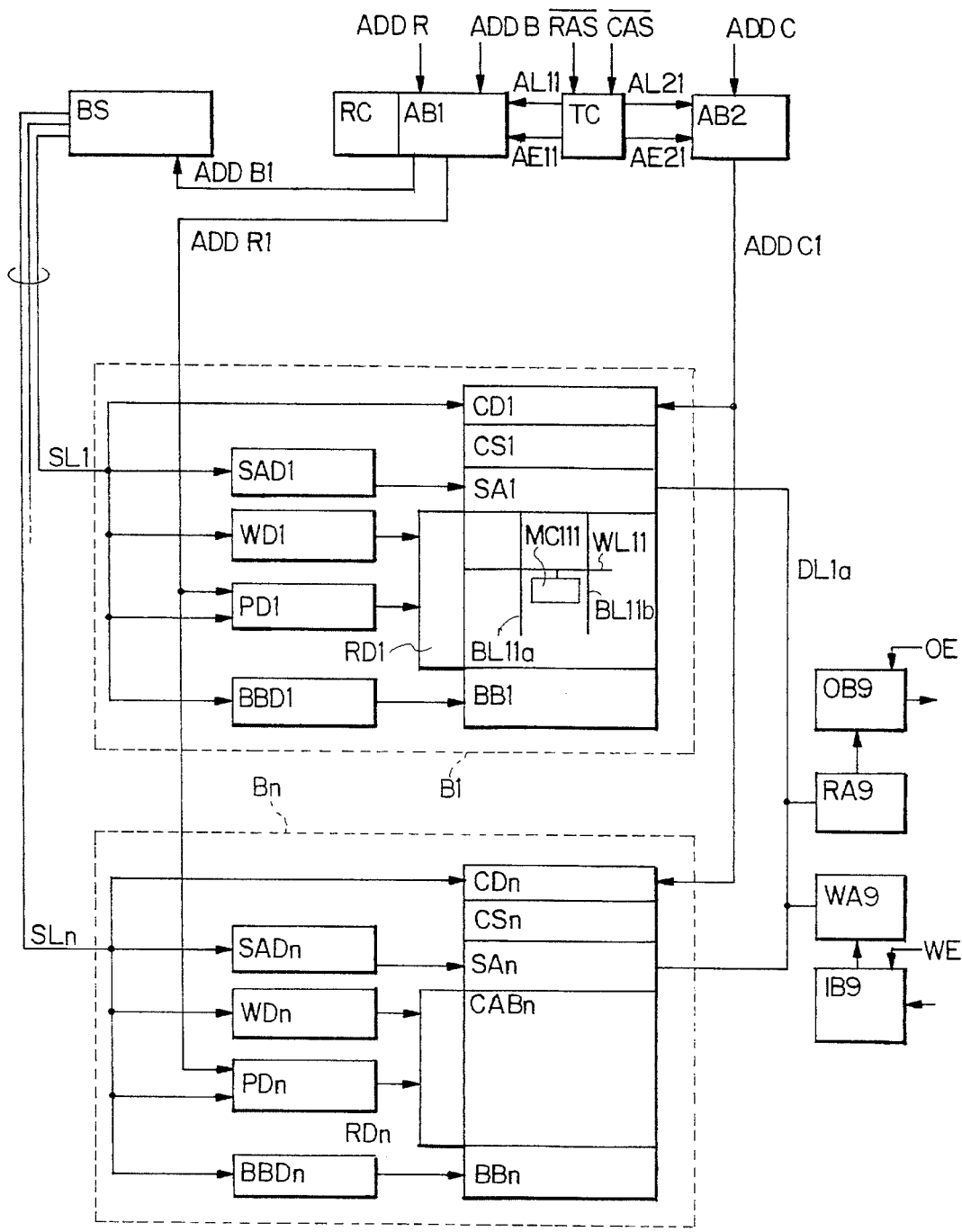
FIG. 11 is a block diagram showing an example of a prior art device.

A memory device according to the present invention is shown in FIG. 1 wherein the elements equivalent to those in the device of FIG. 11 are labeled in the same manner. In this device a memory cell array is divided into the 4 memory cell array blocks. As shown in FIG. 1, the memory device of this embodiment is distinguished from the prior art device in that the block area B1 comprises an address latch circuit AL1a for latching a row address signal AddR1 according to a control signal G11out from a logic gate circuit G11, a block selection signal latch circuit SLL1a for latching a block selection signal SL1s according to the control signal G11out. There is also provided an address change detector ACD1a in the block area B1 which compares the row address signal AddR1 and a output address signal AL1aout of the address latch circuit AL1a according to a control signal G12out from a logic gate circuit G12. The block area B1 also comprises a sense amplifier driver SAD1a, a word driver WD1a and a bit line balance and precharge circuit driver BBD1a each of which is activated according to an output signal SLL1aout of the block selection signal latch circuit SLL1a and deactivated according to an output signal ACD1aout the address change detector ACD1a. The output signal SLL1aout also activates a x-predecoder PD1a which predecodes the address signal AL1aout. The address latch circuit AL1a is associated with a refresh counter RC1. The memory cell array block CAB1 includes word lines WL11, WL12, bit line pairs BL11a, BL11b and memory cells MC111, MC112. Each of the other block areas B4 has the same constitution as the block area B1 as shown in FIG. 1.

The device of this embodiment further comprises an address buffer AB1a for outputting the row and block address signals AddR1, AddB1, a latch control signal LC to the logic gate circuits G11 . . . G41 and a reset control signal RST to the logic gate circuits G12 . . . G42. The block address signal AddB1 is transferred to a block selector BSa for outputting the block selection signals SL1s . . . SL4s and a column control circuit CCa for outputting block control signals SLC1 . . . SLC4 as shown in FIG. 1. The sense amplifier circuit of each block area B1 . . . B4 are connected to a read and write amplifier RWA via a data line DL1.

Preceeding to any access operations to the memory cell array blocks CAB1 . . . CAB4, the block selection signals SL1s, SL4s and the latch control signal LC are at a low level and the reset control signal RST is at a high level, so that each of the block selection signal latch circuits SLL1a . . . SLL4a, which stores initially a low level signal, continue to output a low level signal. The address change detector ACD1a also continues to output a low level signal. Therefore the memory cell array blocks CAB1 . . . CAB4 are in the balanced and precharged state. In this condition, each address latch circuit AL1a . . . AL4a stores initially a null data, that is, for example, an address data which is represented by a plurality of voltage potentials all in the low level.

Figure 2:
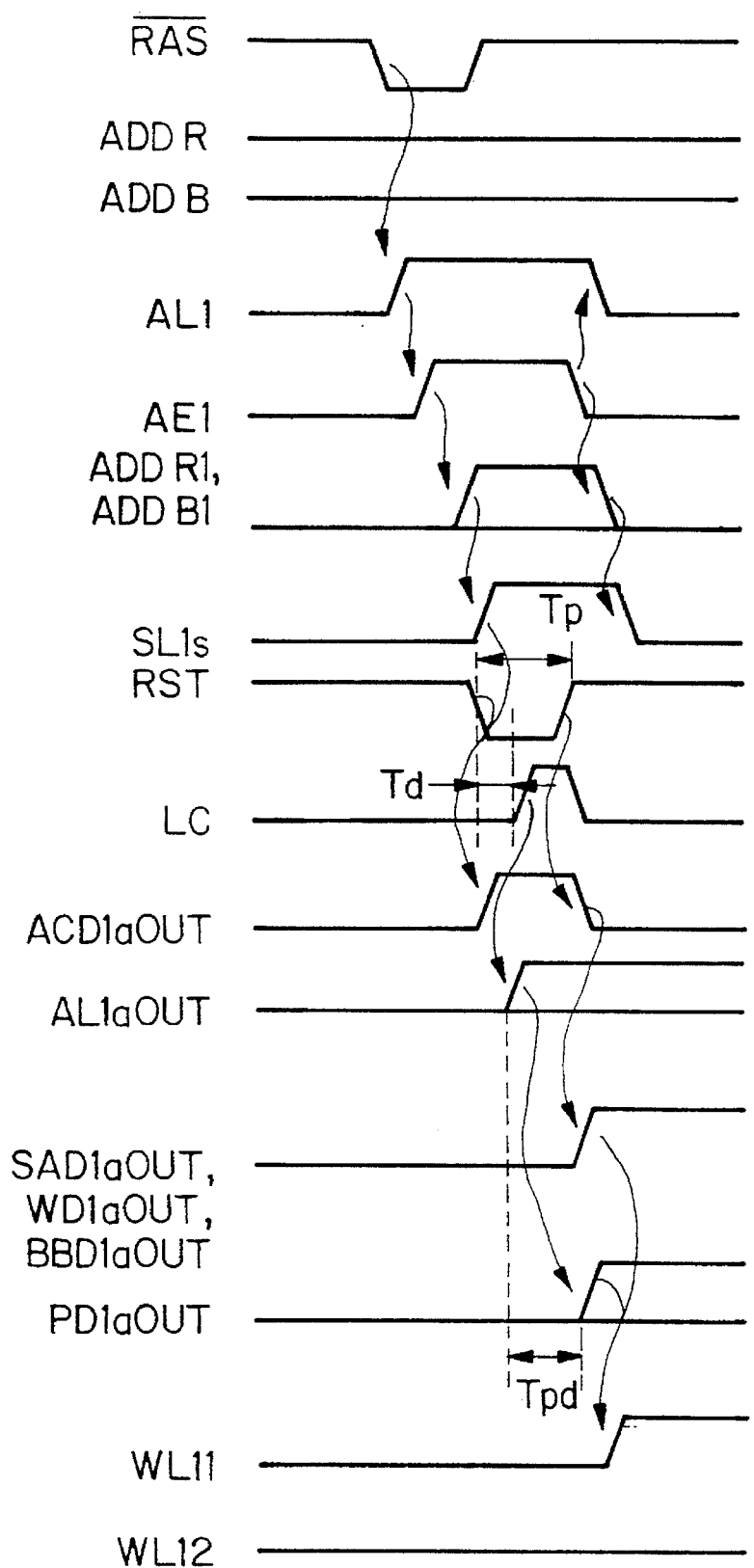
FIG. 2 is a timing chart of the memory device of the first embodiment.

First, the operation for selecting a word line WL11 in the memory cell array block CAB1 will be explained with reference to FIG. 2. After the address signals AddR, AddB are input to the address buffer AB1a, the row address strobe signal $\overline{RAS}$, which is a external input signal for the memory device, goes to the low level as shown in FIG. 2 so that the timing controller TC1 turns the address latch signal AL1 and the address enable signal AE1 for the address buffer AB1a to the high level sequentially. The address buffer AB1a, therefore, latches and outputs the address signals AddR1, AddB1. The block selector BSa decodes the address signal AddB1 and outputs the block selection signal SL1s being at the high level. Meanwhile the address buffer AS1a also outputs the reset control signal RST being at the low level and the latch control signal LC being at the high level sequentially, as shown in FIG. 2, Therefore, according to the transition of the reset control signal RST to the low level, the logic gate circuit G12, which is supplied with the block selection signal SL1s and the reset control signal RST, outputs the control signal G12out being at the high level to the address change detector ACD1a which is activated thereby. In this case, the address change detector ACD1a compares the address signal AddR1 and the output signal of the address latch circuit AL1a which is null as mentioned above so that the address change detector ACD1a turns the output signal ACD1aout to the high level and maintains it during the period corresponding to the low level of the reset control signal RST. The output signal ACD1a is supplied to the sense amplifier driver SAD1a, the word driver WD1a and the bit line balance and precharge circuit driver BBD1a which maintain the output signals SAD1aout, WD1aout and BBD1aout thereof in the low level regardless of the output signal SLL1aout of the block selection signal latch circuit SLL1a.

On the other hand, subsequently to the transition of the reset control signal RST, according to the leading edge of the latch control signal LC, the logic gate circuit G11, which is supplied with the block selection signal SL1s and the latch control signal LC, outputs the control signal G11out being at the high level to the block selection signal latch circuit SLL1a and the address latch circuit AL1a as their input clock signals for indicating the latching operation thereof. So that, the block selection signal latch circuit SLL1a latches the block selection signal SL1s, which is at high level at this time, and supplies the output signal SLL1aout being at the high level to the drivers SAD1a, WD1a, BBD1a and the x-predecoder PD1a. At the same time, the address latch circuit AL1a latches input row address signal AddR1 and supplies the output signal AL1aout representing the new address data to the x-predecoder PD1a. Therefore, since the output signal SLL1a is at the high level and the x-predecoder PD1a is activated, the x-predecoder PD1a immediately starts its decode operation which takes the time Tpd as shown in FIG. 2.

Subsequently, the reset control signal RST goes to the high level so that the address change detector ACD1a turns its output signal ACD1aout to the low level. Therefore, since the output signal SLL1aout is at the high level, the drivers SAD1a, WD1a and BBD1a are activated and, respectively, activate the sense amplifier circuit SA1, the row decoder RD1 and deactivate the bit line balance and precharge circuit BB1. So that, since the predecode operation of the x-predecoder PD1a has been completed up to this time, the row decoder RD1 starts its decode operation.

Accordingly, in the memory cell array block CAB1, after the decode operation of the row decoder RD1, the word line WL11 corresponding to the address signal AddR1 is driven to a predetermined voltage level so as to connect the memory cells MC111 associated therewith to the respective bit line pairs BL11a, BL11b. Meanwhile, the other word lines WL12 in the memory cell array block CAB1 and all of the word lines WL41 . . . WL42 in the other memory cell array blocks CAB4 are maintained at the low level.

As is apparent, in this device, the block selection signal latch circuit SLL1a and the address latch circuit AL1a continue to latch and output respectively the signal SLL1aout being at the high level and the signal AL1aout representing the address signal AddR1 of the preceding access operation. Therefore, in the memory cell array block CAB1, the word line WL11 which is selected in the preceding access operation remains activated until the access operation wherein another word line WL12 in the memory cell array block CAB1 is selected will be performed.

That is, if the following access operation on the memory cell array block CAB1 indicates the same word line WL11, the input address signals of the address change detector ACD1a are the same to each other so that the detector ACD1a does not supply the high level output signal ACD1aout to the drivers SAD1a, WD1a and BBD1a. Therefore the balance and precharge operation on the memory cell array block CAB1 is not performed and the high voltage level of the word line WL11 is maintained continuously.

Therefore, after at least one access operation on each memory cell array block CAB1 . . . CAB4, all of the memory cell array blocks CAB1 . . . CAB4 remain activated, each having one word line being selected.

Consequently, according to this device, since the operation for activating and/or deactivating the word line is indicated only by the transition of the signal $\overline{RAS}$ to the low level, it is not needed to secure any long interval between the end of an access operation on a memory cell array block and the start of the following access operation on an another memory cell array block. Therefore the access speed of this device is increased, that, is, it is possible to input the external input signal $\overline{RAS}$ having a high frequency. In detail, from a basic calculation, in the case where the memory cell array of the device is divided into 4 blocks as mentioned above, the operation speed of this device is improved in three access operations out of four.

This will be explained in more detail with reference to FIG. 3 and 4 which show timing charts of the access operations of this device which are performed sequentially, that is, one starts at the time t1 and the other one starts at the time t2. A read and a write operations are performed in almost the same manner in this device so that the read operation will be described in detail as below.

In this case, the block selection signal latch circuits SLL1a and SLL4a have already latched the block selection signals SL1s and SL4s being at the high level during any preceding access operations and maintain output signals SLL1aout and SLL4aout thereof at the high level. Therefore, since the drivers SAD1a, SAD4a, WD1a, WD4a, BBD1a and BBD4a and the x-predecoders PD1a and PD4a are initially activated, the selected word lines WL11 and WL41 of each of the memory cell array blocks CAB1 and CAB4 remains activated to the predetermined voltage level. After the address signals AddR, AddB are input to the address buffer AB1a, the row address strobe $\overline{RAS}$ goes to the low level at the time t1 and, accordingly, the block selection signal SL1s is output and the reset control signal RST and the latch control signal LC are also output in a same manner as mentioned above. FIGS. 3 and 4 correspond to a case where a new word line WL12 in the cell array block CAB1 is to be selected in the access operation beginning at the time t1, so that the word line WL11 is deactivated and, after the balance and precharge operation on the block CAB1 is performed, the word line WL12 is activated as shown in FIG. 4.

Meanwhile, the external input signal $\overline{CAS}$ goes to the low level and, in the same manner as the address buffer AB1, the address buffer AB2 output the address signal AddC1 according to the signals AL2, AE2 to each column decoder CD1 . . . CD4. Moreover, the column control circuit CC which receives the block address signal AddB1 and the signal CAS outputs the block control signal SLC1 selectively which activates the column decoder CD1 of the selected block area B1. Therefore, after the word line WL12 is activated and the stored data of the memory cells MC112 are amplified by the sense amplifier circuit SA1, the column selector CS1 connect the selected bit line pair BL11a, BL11b to the data line DL1. The data transfer operation to the read and write amplifier RWA on the data line is completed at the time t3 as shown in FIG. 3.

Figure 3:
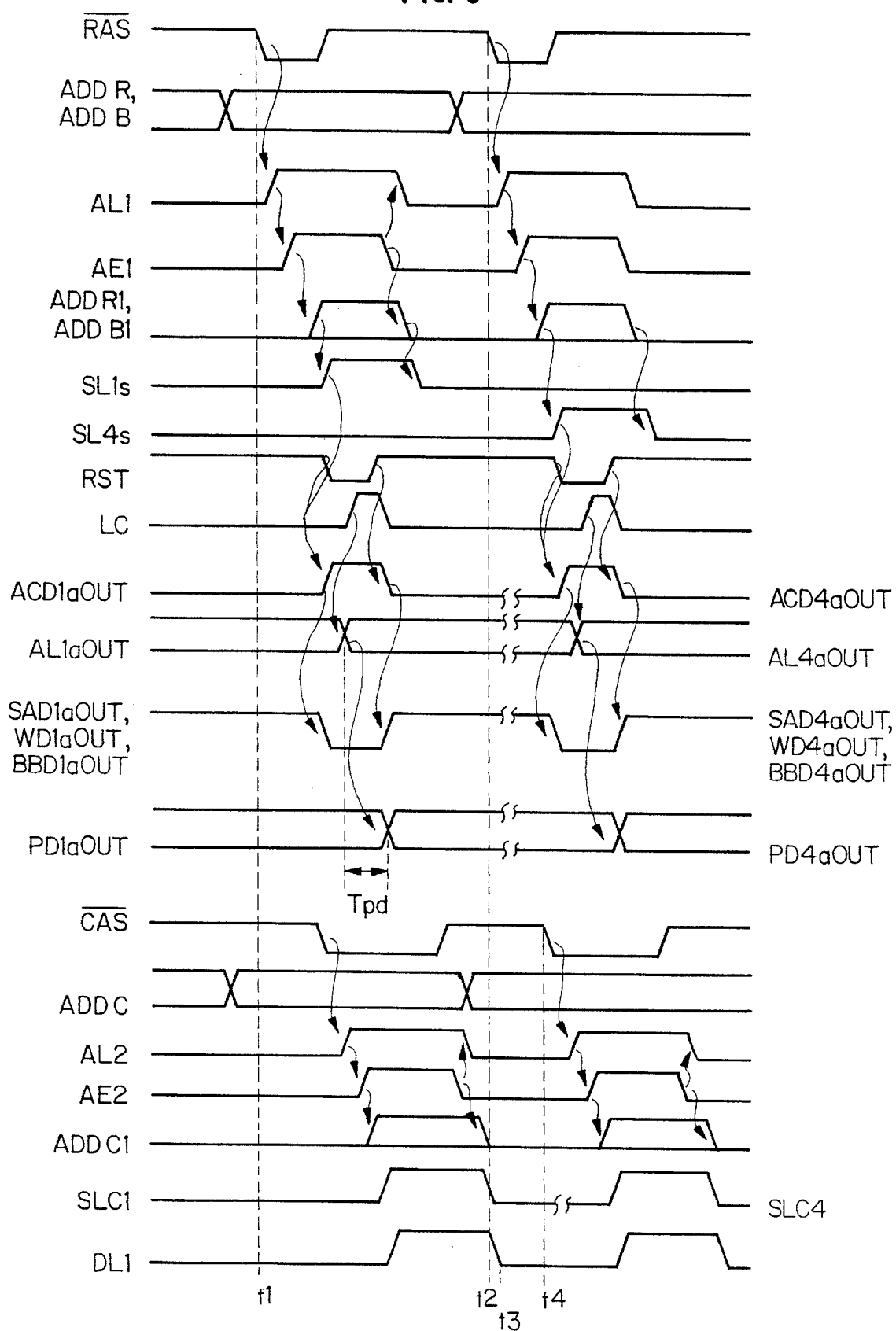
FIG. 3 is a timing chart of the memory device of the first embodiment.
Figure 4:
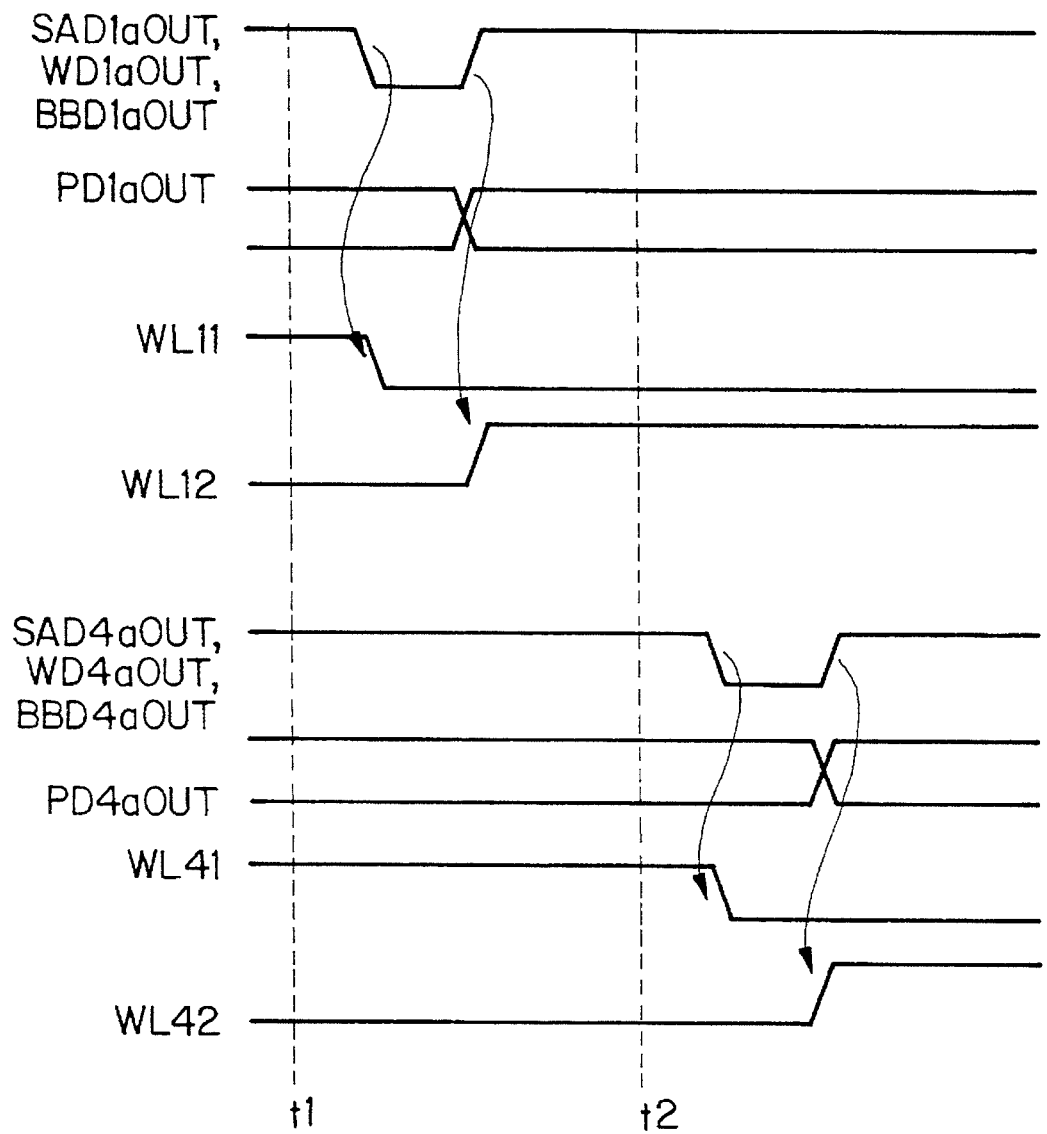
FIG. 4 is an another timing chart of the memory device of the first embodiment.
Figure 12:
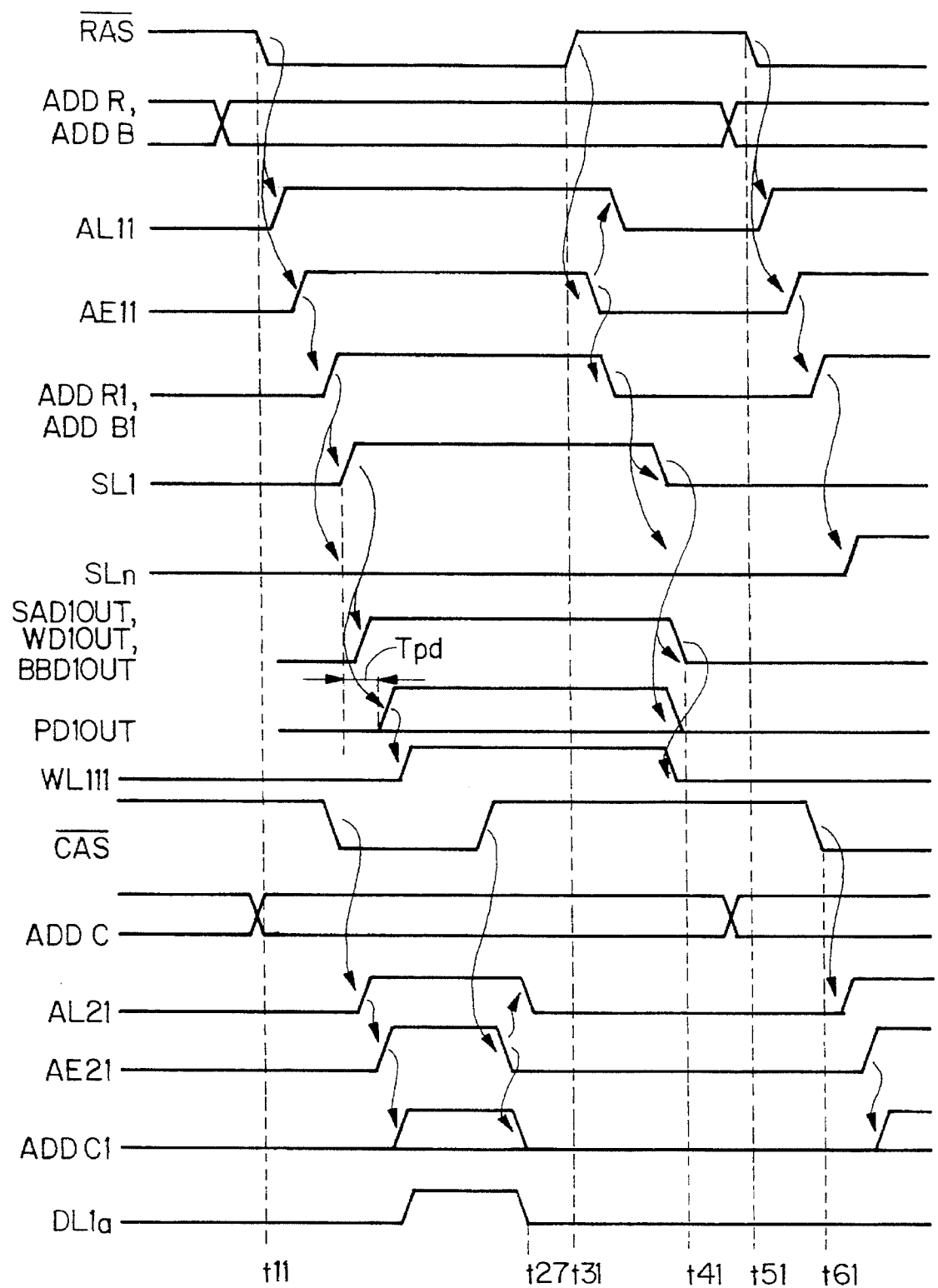
FIG. 12 is a timing chart of the prior art device.

The next access operation on the memory cell array block CAB4 following this access operation on the block CAB1 is also performed in the same manner wherein the signals $\overline{RAS}$, $\overline{CAS}$ go to the low level respectively at the time t2, t4 and the word line WL42 is selected in the memory cell array block CAB4 as shown in FIGS. 3, 4. As is apparent from the above, according to this embodiment, the following access operation on the memory cell array block CAB4 can be started at the time t2 preceding to the time t3. In other words, since the word line WL12 remains activated even after the signal $\overline{RAS}$ goes to the low level at the time t2 indicating the next access operation on the memory cell array block CAB4, there is not any fear of errors in the access operation corresponding to the word line WL12 and it is possible to safely perform and complete the read or write operation on the block CAB1. It is only needed, in this device, to secure a small interval between the time t3, when the access operation is completed, and t4, when the signal $\overline{CAS}$ goes to the low level to perform the next access operation. It is apparent that the period between the time t3 and t4 according to this embodiment, which determines the operation speed of the device, is considerably short compared with the period between the time t21 and t61 in FIG. 12 which is needed for the conventional memory devices.

Moreover, since each memory cell array block CAB1 . . . CAB4 is associated with the address latch circuit AL1a . . . AL4a, it is also possible to equip the address latch circuits AL1a ... AL4a with the refresh counter RC1 ... RC4 respectively, as shown in FIG. 1 so as to perform the refresh mode operation on the memory cell array blocks CAB1 ... CAB4 independently from each other. Therefore, it is possible to perform the access operations on the memory cell array blocks (Ex: CAB1) even when any other blocks (Ex: CAB2 ... CAB4) are in the refresh operation thereof. These latch circuits SLL1a ... SLL4a, AL1a ... AL4a, the logical gate circuits (G11 and G12), (G41 and G42), the address change detectors ACD1a ... ACD4a and the refresh counters RC1 ... RC2 each do not have a complex structure and can be formed close to of the memory cell array blocks CAB1 ... CAB2 so that the increase in the whole size of this device is not large.

Figure 5:
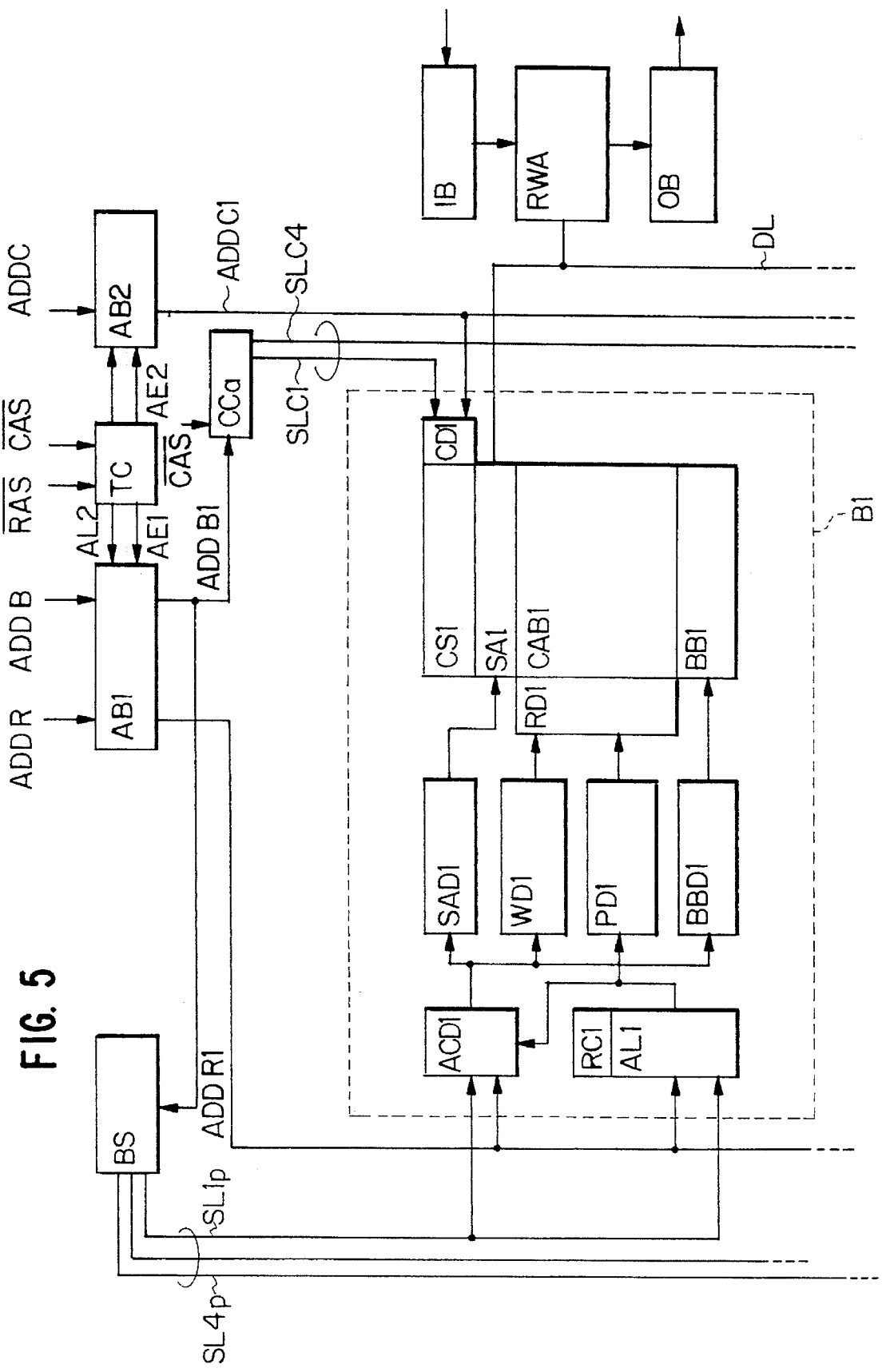
FIG. 5 is a block diagram of a main part of a memory device of the second embodiment.

The second embodiment of this device will be described. As shown FIG. 5, wherein the elements equivalent to those in FIG. 11 have the same reference character, the memory device of this embodiment comprises a block selector BS for outputting the block selection signals SL1p ... SL4p selectively according to the block address signal AddB1. Each block area B1 of this memory device has an address latch circuit AL1 for latching the address signal AddR1 according to the leading edge of the signal SL1p and output the signal AL1out corresponding to the new address signal AddR1 according to the end of the signal SL1p. The block area B1 also has an address change detector ACD1 for comparing the output signal AL1out of the address latch circuit AL1 and the address signal AddR1 from the address buffer AB1 according to the leading edge of the signal SL1p and, when those two signals are different from each other, turns its output signal ACD1 to the low level and, after a predetermined time period has passed, turns it to the high level.

Figure 6:
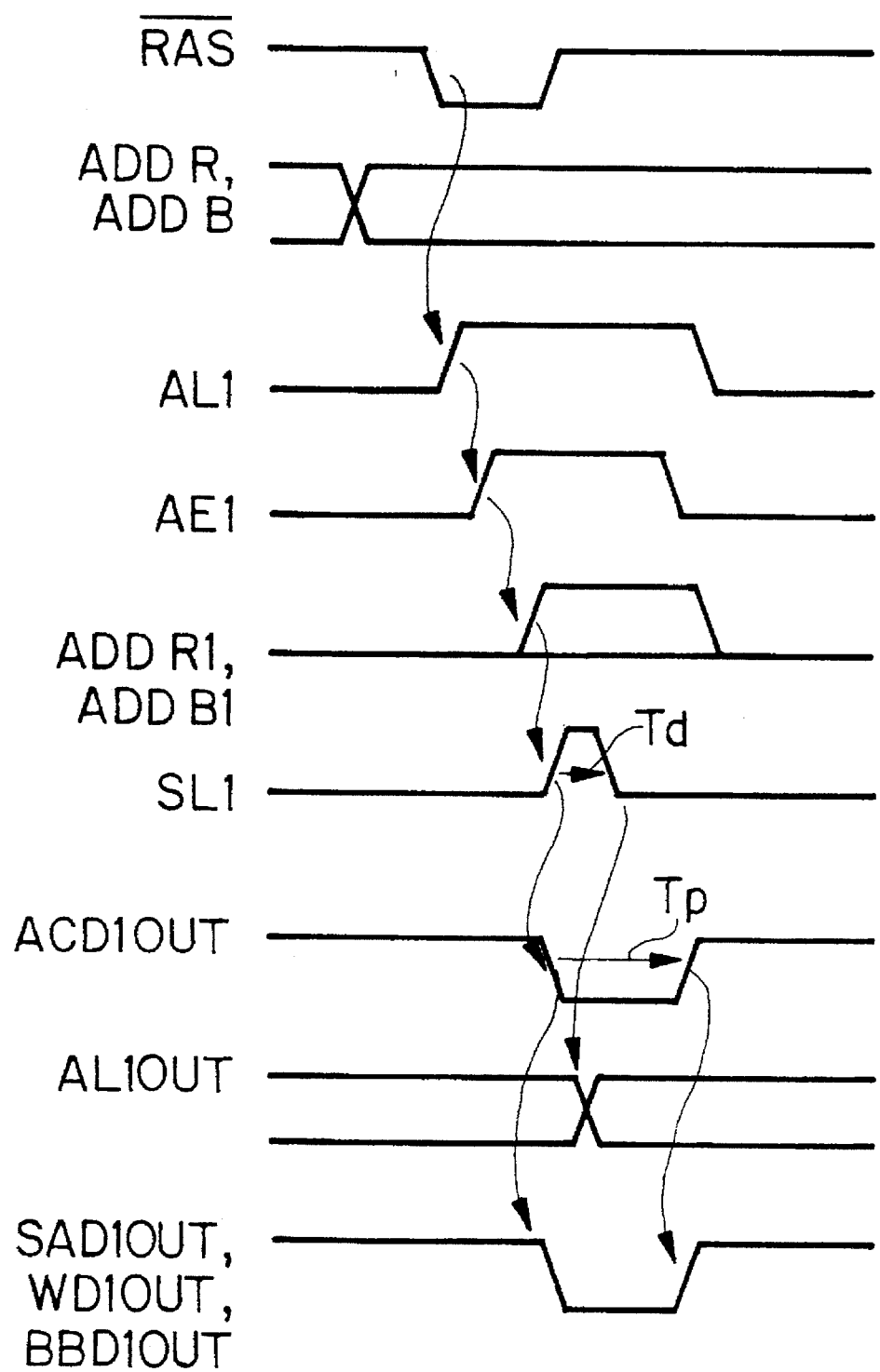
FIG. 6 is a timing chart of the memory device of the second embodiment.

According to this structure, as shown in FIG. 6, the time interval Td in which the address latch circuit AL1 supplies its output signal AL1out corresponding to the address signal of the preceding access operation to the address change detector ACD1 and the new address signal AddR1 is also supplied to the detector ACD1 as shown in FIG. 6 is determined by the block selection signal SL1p itself, whereas the time interval Td of the first embodiment is determined by the reset control signal RST and the latch control signal LC as shown in FIG. 2. Moreover, the time period Tp corresponding to the balance and precharge operation on the memory cell array block CAB1 as shown in FIG. 6 is determined by the address change detector ACD1 itself, whereas the time interval Tp of the first embodiment determined by the reset control signal RST. Therefore, according to this embodiment, the signal lines for the reset control signal RST or the latch control signal LC are not needed, making the area of the device small. This device performs the read, write or refresh operations in almost the same manner as the first embodiment and also achieves the same high speed access operations as the first embodiment.

Figure 7:
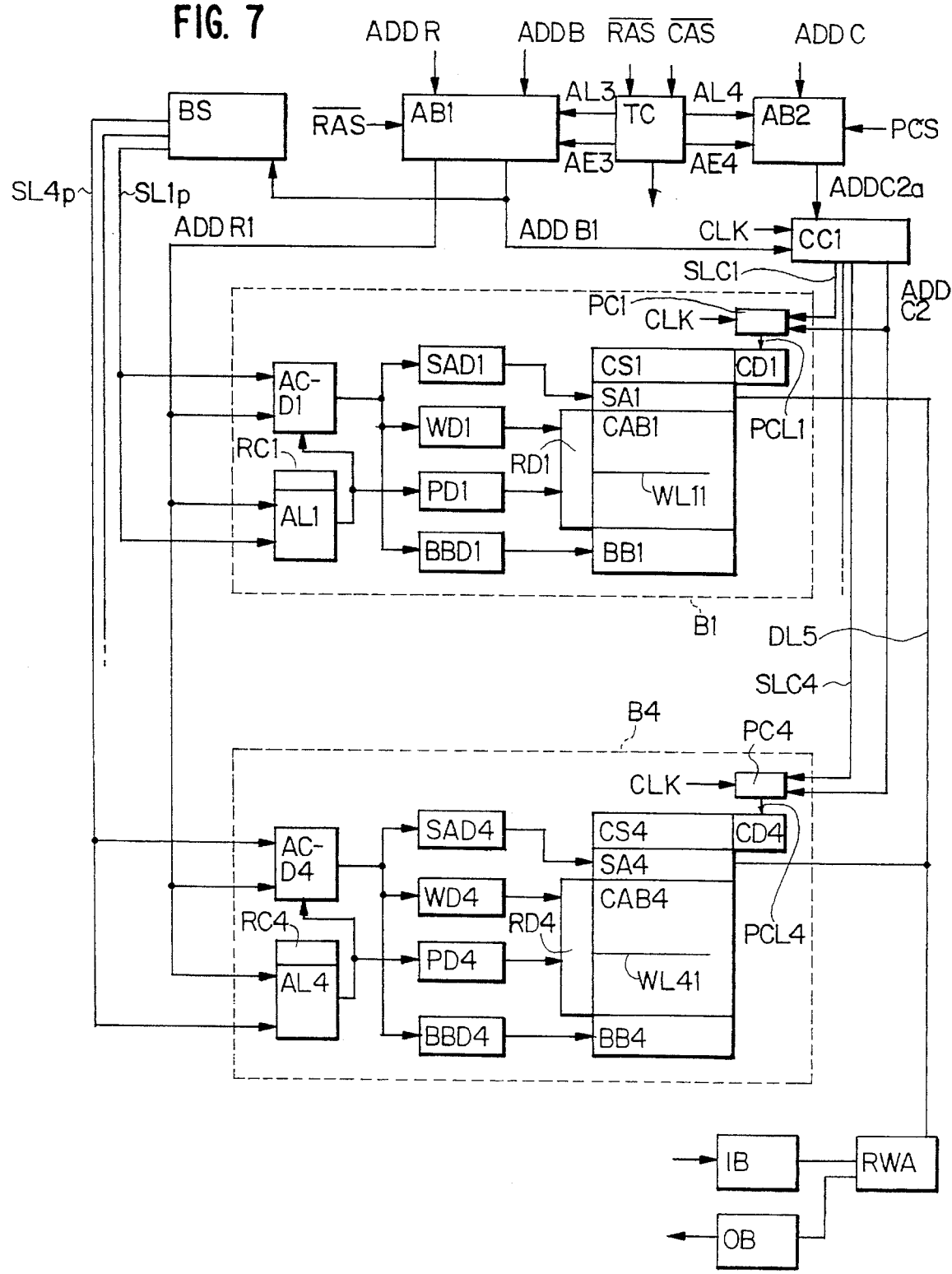
FIG. 7 is a block diagram of a memory device of the third embodiment.
Figure 8:
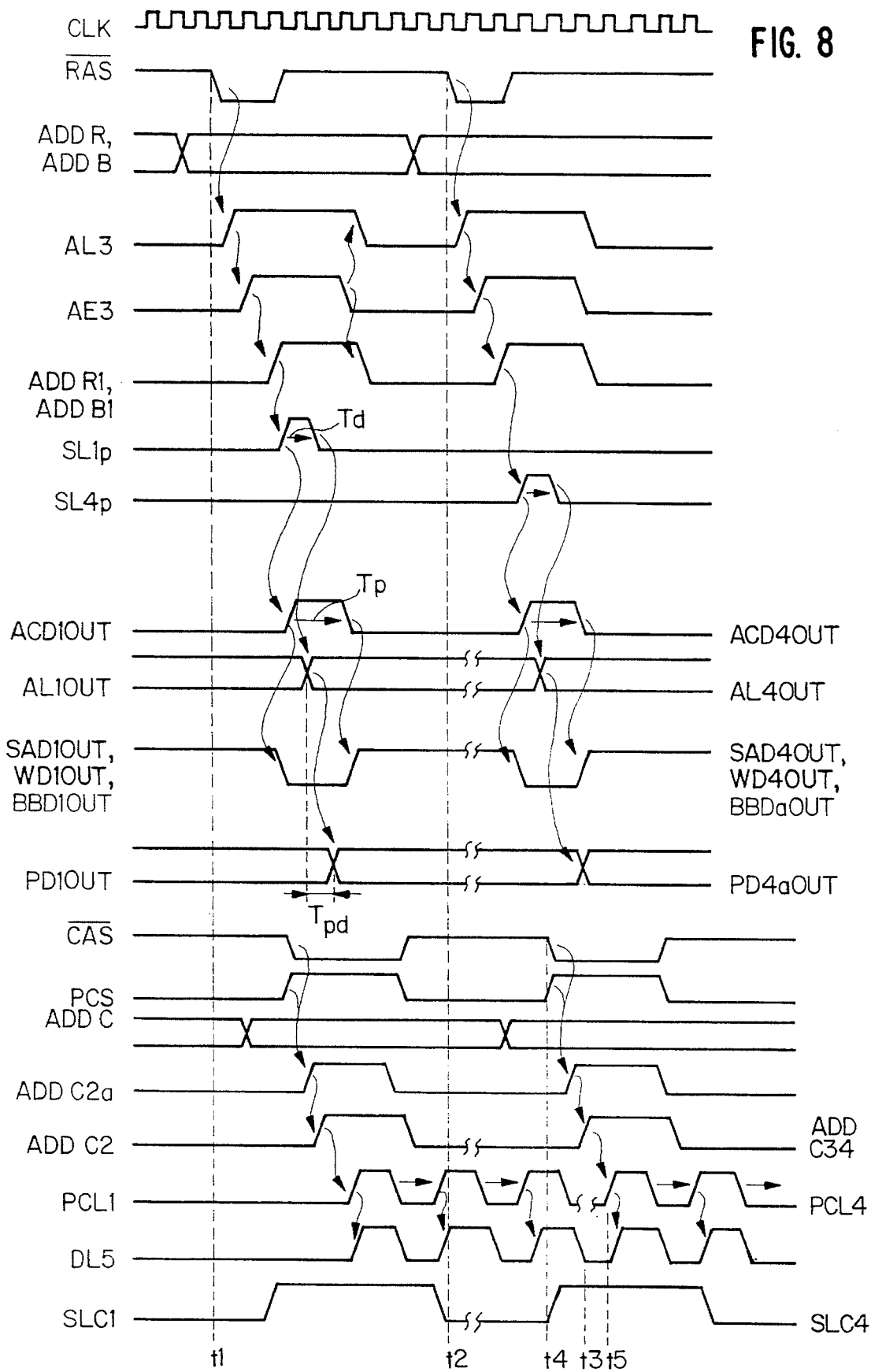
FIG. 8 is a timing chart of the memory device of the third embodiment.

FIGS. 7, 8 show the third embodiment of the invention which corresponds to a case where the device performs the page mode operations sequentially. This device has nearly the same constitution as the device of the second embodiment except for the address buffer AB2 receiving the column address signal AddC and a page mode control signal PCS and outputting a page address signal AddC2a to the column control circuit CC1. Moreover, each of the column decoders CD1 ... CD4 of the memory cell array blocks CAB1 ... CAB4 is associated with a page counter PC1 ... PC4 which is supplied with the address signal AddC2 and the block control signal SLC1 ... SLC4.

According to FIG. 8, the signal $\overline{RAS}$ goes to the low level at the time t1 indicating a beginning of an access operation. The part of the operation corresponding to the row address signal AddR and the block selection signal SL1p ... SL4p for selecting the word line WL11 is the same as that of the second embodiment.

When the signal $\overline{CAS}$ goes to the low level and the page mode control signal PCS goes to the high level, the address buffer circuit AB2 latches the column address signal AddC which indicates the first address of the page mode operation and outputs the page address signal AddC2a to the column control circuit CC1. The column control circuit CC1 is also supplied with the block address signal AddB1 and a common clock signal of the device CLK from the timing controller TC and outputs the page address signal AddC2 and the block control signal SLC1 ... SLC4 according to the clock signal CLK after a predetermined delay time in order to secure the time needed for activating the selected word line WL11. The page address signal AddC2 is supplied to each page counter PC1 ... PC4 which latches it according to the block control signal SL1 ... SL4. In this case, the operation beginning at the time t1 is a page mode operation corresponding to the word line WL11 of the memory cell array block CAB1 whereas the operation beginning at the time t2 is a page mode operation corresponding to the word line WL41 of the memory cell array block CAB4. Therefore, as shown in FIG. 8, the address signal AddC2 is input to the page counter PC1 which outputs the page address signal PCL1 to the column decoder CD1 according to the clock signal CLK. The page address signal PCL1 indicates the column addresses continuously as shown in FIG. 8. Accordingly, since the selected word line WL11 is activated at this time, the column selector CS1 connects the bit line pairs corresponding to the page address signal PCL1 to the data line DL5 so as to output the data stored in the memory cells associated with the word line WL1 to the read and write amplifier RWA via the data line DL5 continuously up to the time t3 as shown in FIG. 8.

Meanwhile, the signal $\overline{RAS}$ goes to the low level at the time t2, which precedes the time t3 as shown in FIG. 8, the operation for selecting the word line WL41 of the memory cell array block CAB4 begins. This operation is performed in the same manner as the above mentioned operation on the memory cell array block CAB1. At the time t4, which is the same as or just before the time t3, the signal $\overline{CAS}$ goes to the low level and the operation corresponding to the column signal AddC of the memory cell array block CAB4 begins. In this case, the page counter PC4 associated with the memory cell array block CAB4 is also supplied with the common clock signal CLK of the device so as to be synchronized with the column control circuit CC1 and the page counter PC1. Therefore, the column control circuit CC1 can adjust the timing for output the block control signal SLC4 and the address signal AddC2 corresponding to the column address of the memory cell array block CAB4 so that the page counter PC4 outputs the page address signal PCL4 to the column decoder CD4 at the time t5 just after the time t3. Accordingly, the data corresponding to the memory cell array block CAB1 and the data corresponding to the memory cell array block CAB4 are continuously output to the read and write amplifier RWA via the data line DL5 as shown in FIG. 8. The page mode operations for writing data into the memory cell array blocks CAB1 ... CAB4 are also performed in nearly the same manner.

Therefore, according to this embodiment, the page mode operations can be performed continuously, that is, with no long intervals between the page mode operations, so as to increase the total operation speed of the device effectively. Moreover, since the page mode operations performed sequentially are synchronized with each other, it is possible to handle the data which corresponds to different word lines WL11, WL41 in different memory cell array blocks CAB1, CAB4 as a single group of the data which forms a single page of the memory device, compensating for the short length of the word lines of this type of memory device having a plurality of memory cell array blocks, so that the device of this embodiment can have a broad range of applications.

Figure 9:
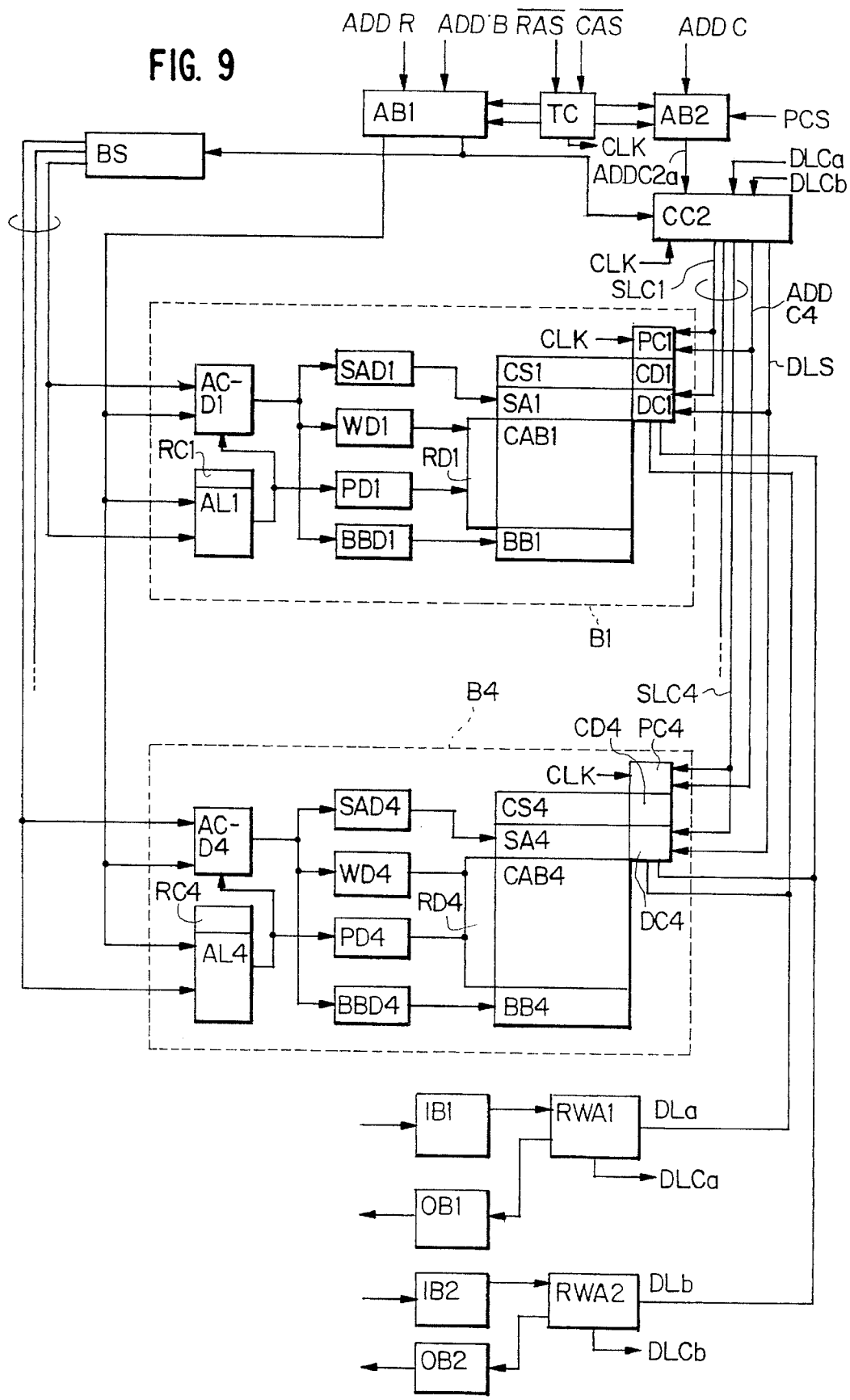
FIG. 9 is a block diagram of a memory device of the fourth embodiment.

The fourth embodiment of the invention will be described with reference to the FIGS. 9 and 10. The memory device of this embodiment has the nearly same constitution as the device of the third embodiment except for the datalines DLa, DLb for transfer the read and/or write data signal between the each cell array block CAB1 ... CAB4 and the read and write amplifiers RWA1 and RWA2, respectively, as shown in FIG. 9. The device also has a column control circuit CC2 for outputting a data line selection signal DLS to data line controllers DC1 ... DC2 each associated with the memory cell array block CAB1 ... CAB4. The read and write amplifier RWA1 and RWA2 output, respectively, the data line control signals DLCa and DLCb which represent whether or not the data lines DLa, DLb are used for transferring any data signals.

Figure 10:
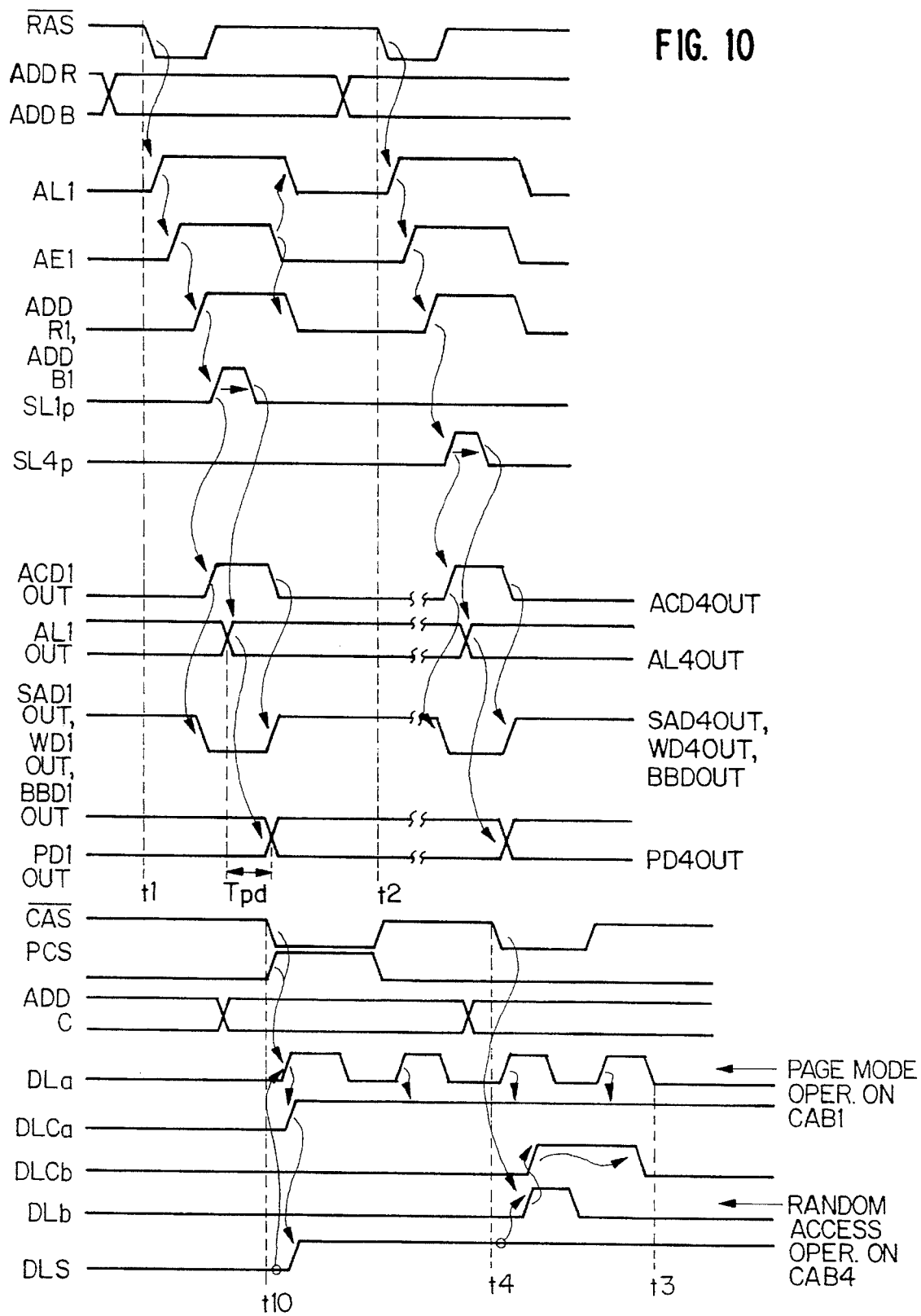
FIG. 10 is a timing chart of the memory device of the fourth embodiment.

The operation of this device is explained in a case where the page mode operation on the memory cell array block CAB1 begins at the time t1 and the random access operation on the memory cell array block CAB4 begins at the time t2 which is immediately after the time t1 so that the page mode operation and the randam access operation are substantially performed at the same time as shown in FIG. 10. The operations corresponding to the row address signal AddR are performed in the same manner as the second or the third embodiment. The data line control signals DCLa and DLCb are initially at the low level as shown in FIG. 10. Then, after the time t1, when the signal $\overline{CAS}$ goes to the low level at the time 10, the column control circuit CC2 outputs the data address signal AddC4 to each of the page counters PC1 ... PC4 and the block control signal SLC1 to the page counter PC1. Therefore, in the same manner as the third embodiment, the dataline is continuously selected by the column selector CS1 and connected to the data line controller DC1. In this condition, the column control circuit CC2 maintains the data line selection signal DLS for the data line controller DC1 at the low level. Accordingly, the data line controller DC1 select the data line DLa and connect the selected bit line pairs to it. Therefore the data stored in the memory cell array block CAB1 are transferred to the read and write amplifier RWA1 via the data line DLa continuously until the time t3 as shown in FIG. 10. When the read data signal is transferred on the data line DLa, the read and write amplifier RWA1 turns the data line control signal DLCa to the high level so that the column control circuit CC2 turns the data line selection signal DLS to the high level.

Meanwhile, the signal $\overline{CAS}$ goes to the low level at the time t4, which is before the time t3, indicating the random access operation on the memory cell array block CAB4. The column control circuit CC2 outputs the address signal AddC4, the block control signal SLC4 and the data line selection signal DLS4 to the page counter PC4 and the data line controller DC4. Therefore, since the data line selection signal DLS is at the high level, the data line controller DC4 select the data line DLb and the selected bit line pair in the memory cell array block CAB4 are connected to the data line DL4 so as to output the data to the read and write amplifier RWA2. When the read data signal appears on the data line DLb, the read and write amplifier RWA2 turns the data line control signal DLCb to the high level so that, since the data line control signal DLCa is also at the high level, the column control circuit CC2 stops receiving any other address data AddC2a from the address buffer AB2. While the read mode operation are described in the above, the device operates in the almost same manner when the write operations are performed. Moreover, it is apparent that the device can perform two page mode operations each corresponding to a different memory cell array blocks CAB1 ... CAB4.

Therefore, according to this embodiment, when a page mode operation is performed on a memory cell array block (Ex: CAB1), which takes a comparatively long time, it is possible to perform another access operation on the different memory cell array blocks (Ex: CAB2 ... CAB4). Therefore, the device of this embodiment is capable of permitting the achievement of extensive applications such as the frame buffer application as mentioned above.

I claim:

1. A semiconductor memory device comprising:

a plurality of memory cell array blocks each having at least one word line and at least one pair of bit lines and associated with a word line drive circuit, a precharge circuit and a sense amplifier circuit;

a block select circuit for selectively outputting a block select signal corresponding to one of said memory cell array blocks; and an address buffer for outputting word address signals to said memory cell array blocks, wherein said word line drive circuit is associated with an address latch circuit which latches and continuously outputs one of said word address signals thereto according to a first logical level of said block select signal, said word line driver circuit continuously activates said word line according to an output signal of said address latch circuit and changes said word line from a selection level to a non-selection level in response to said first logical level of said block select signal.

2. The semiconductor memory device according to claim 1 wherein said precharge circuit is activated according to said first logical level of said block select signal to precharge said bit lines and deactivated after said predetermined time period.

3. The semiconductor memory device according to claim 2 wherein said sense amplifier circuit is activated according to said first logical level of said block select signal to amplify voltages of said bit lines and deactivated after said predetermined time period.

4. A semiconductor memory device comprising:

a plurality of memory cell array blocks each having at least one word line and at least one pair of bit lines and associated with a word line drive circuit, a precharge circuit and a sense amplifier circuit;

a block select circuit for selectively outputting a block select signal corresponding to one of said memory cell array blocks;

an address latch circuit associated with said word line drive circuit and a refresh counter; and an address buffer for outputting word address signals to said memory cell array blocks, wherein said word line drive circuit associated with said address latch circuit which latches and continuously outputs one of said word address signal thereto according to a first logical level of said block select signal and said word line driver circuit continuously activates said word line according to an output signal of said address latch circuit.

5. A semiconductor device comprising:

a plurality of memory cell blocks each including a plurality of word lines, a plurality of bit lines and a plurality of memory cells each provided at one of intersections of said word lines and said bit lines;

a plurality of block selection signals provided correspondingly to said memory cell blocks;

a control circuit block responding to a part of address information to change one of said plurality of block selection signals to an active level;

a plurality of latch circuits, each provided for an associated one of said memory cell blocks, which latch a remaining portion of said address information in response to said active level of an associated one of said block selection signals; and a plurality of word drivers, each provided for an associated one of said memory cell blocks, for selecting one of said word lines in response to a content of an associated one of said latch circuits and driving said one of said word lines to a selection level, said one of said word lines being maintained to said selection level until the content of said associated one of said latch circuits is changed.

* * * * *

UNITED STATES PATENT AND TRADEMARK OFFICE
CERTIFICATE OF CORRECTION

PATENT NO. : 5,495,454
DATED : February 27, 1996
INVENTOR(S) : Yukio Fukuzo

It is certified that error appears in the above-indentified patent and that said Letters Patent is hereby corrected as shown below:

Column 1, lines 50-51, delete "prodecodes" and insert --predecodes--.

Column 2, line 49, delete "CAS" and insert -- $\overline{CAS}$ --.

Column 2, line 62, delete "Db1a" and insert --DL1a--.

Column 9, line 11, delete "RC2" and insert --RC4--.

Column 9, line 13, delete "CAB2" and insert --CAB4--.

Column 11, line 15, delete "CAB4" and insert --CAB2--.

Column 11, line 29, delete "DCLa" and insert --DLCa--.

Signed and Sealed this

Second Day of July, 1996

Attest:

BRUCE LEHMAN

*Attesting Officer*   *Commissioner of Patents and Trademarks*